US009837480B2

(12) United States Patent
Gai et al.

(10) Patent No.: US 9,837,480 B2
(45) Date of Patent: Dec. 5, 2017

(54) ARRAY SUBSTRATE WITH DOUBLE-GATE TFT, METHOD OF FABRICATING THE SAME, AND DISPLAY DEVICE

(71) Applicant: BOE TECHNOLOGY GROUP CO., LTD., Beijing (CN)

(72) Inventors: Cuili Gai, Beijing (CN); Danna Song, Beijing (CN); Baoxia Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/787,396

(22) PCT Filed: Mar. 18, 2015

(86) PCT No.: PCT/CN2015/074494
§ 371 (c)(1),
(2) Date: Oct. 27, 2015

(87) PCT Pub. No.: WO2016/074401
PCT Pub. Date: May 19, 2016

(65) Prior Publication Data
US 2016/0307986 A1 Oct. 20, 2016

(30) Foreign Application Priority Data

Nov. 10, 2014 (CN) .......................... 2014 1 0645780

(51) Int. Cl.
*H01L 29/00* (2006.01)
*H01L 27/32* (2006.01)
(Continued)

(52) U.S. Cl.
CPC .......... *H01L 27/3272* (2013.01); *H01L 21/77* (2013.01); *H01L 27/12* (2013.01);
(Continued)

(58) Field of Classification Search
CPC ... H01L 27/12; H01L 27/124; H01L 27/3248; H01L 27/1248; H01L 27/3258; H01L 29/78645; H01L 29/78678; H01L 27/1251
See application file for complete search history.

(56) References Cited

U.S. PATENT DOCUMENTS 5,566,014 A 10/1996 Glance
7,776,662 B2 8/2010 Wang et al.
(Continued)

FOREIGN PATENT DOCUMENTS

CN 101005083 A 7/2007
CN 101165906 A 4/2008
(Continued)

OTHER PUBLICATIONS

International Search Report of PCT/CN2015/074494 in Chinese, dated Jul. 29, 2015 with English translation.
(Continued)

*Primary Examiner* — Ngan Ngo
(74) *Attorney, Agent, or Firm* — Collard & Roe, P.C.

(57) ABSTRACT

An array substrate, a method for fabricating the array substrate and a display device are described. The array substrate includes: a first gate electrode metal layer; a first gate insulation layer; an active layer on the first gate insulation layer; an etching barrier layer on the active layer; a source-drain metal layer including a source electrode and a drain electrode that contact with two sides of the active layer respectively; a second gate insulation layer on the source-drain metal layer; and a second gate electrode metal layer on the second gate insulation layer. The array substrate has an optimized TFT performance and a reduced gate line resistance, and light may be blocked from irradiating on the active layer, which is beneficial to restrain IR Drop, drifting of TFT threshold voltages or generation of a light-incurred (Continued)

leakage current on the active layer. Performance of the display device is improved.

20 Claims, 4 Drawing Sheets

(51) Int. Cl.
*H01L 27/12* (2006.01)
*H01L 29/786* (2006.01)
*H01L 21/77* (2017.01)

(52) U.S. Cl.
CPC .......... *H01L 27/124* (2013.01); *H01L 27/127* (2013.01); *H01L 27/1214* (2013.01); *H01L 27/1248* (2013.01); *H01L 27/1251* (2013.01); *H01L 27/3248* (2013.01); *H01L 27/3258* (2013.01); *H01L 29/78645* (2013.01); *H01L 29/78648* (2013.01); *H01L 29/78678* (2013.01); *H01L 27/3262* (2013.01); *H01L 2227/323* (2013.01)

(56) References Cited

U.S. PATENT DOCUMENTS

| | | | | |
|---|---|---|---|---|
| 8,624,254 B2* | 1/2014 | Egi | .................. | H01L 29/78618 257/60 |
| 8,835,917 B2* | 9/2014 | Yamazaki | ......... | H01L 29/78648 257/365 |
| 9,324,875 B2* | 4/2016 | Yamazaki | ........... | H01L 29/7869 |
| 9,425,220 B2* | 8/2016 | Miyake | ............... | H01L 27/1255 |
| 2002/0158829 A1* | 10/2002 | Yamazaki | ............ | G09G 3/3266 345/92 |
| 2004/0246765 A1* | 12/2004 | Kato | ..................... | G11C 11/404 365/149 |
| 2005/0275038 A1* | 12/2005 | Shih | .................. | H01L 29/78633 257/382 |
| 2010/0301326 A1* | 12/2010 | Miyairi | ............... | H01L 27/1225 257/43 |
| 2011/0124153 A1* | 5/2011 | Hosoba | ............. | H01L 21/02554 438/104 |
| 2011/0169001 A1* | 7/2011 | Ozeki | ............... | H01L 29/78696 257/59 |
| 2011/0318888 A1* | 12/2011 | Komatsu | ............. | C23C 16/0272 438/157 |
| 2012/0001178 A1* | 1/2012 | Miyairi | ............. | H01L 29/78609 257/53 |
| 2012/0018706 A1* | 1/2012 | Kagan | ................. | H01L 51/0558 257/40 |
| 2012/0052637 A1* | 3/2012 | Komatsu | ............. | H01L 21/0245 438/157 |
| 2013/0334533 A1* | 12/2013 | Yamazaki | ........... | H01L 29/7869 257/57 |
| 2014/0042437 A1* | 2/2014 | Yamazaki | ........ | H01L 29/78693 257/43 |
| 2014/0183529 A1* | 7/2014 | Yamazaki | ........... | H01L 29/7869 257/43 |
| 2014/0339542 A1* | 11/2014 | Yamazaki | ........... | H01L 29/7869 257/43 |
| 2015/0053973 A1* | 2/2015 | Yamazaki | ........... | H01L 27/1225 257/43 |
| 2015/0109553 A1* | 4/2015 | Kubota | ............... | H01L 27/1255 349/46 |

FOREIGN PATENT DOCUMENTS

| | | |
|---|---|---|
| CN | 101644866 A | 2/2010 |
| CN | 103456744 A | 12/2013 |
| CN | 104319279 A | 1/2015 |

OTHER PUBLICATIONS

Notice of Transmittal of the International Search Report of PCT/CN2015/074494 in Chinese, dated Jul. 29, 2015.
Written Opinion of the International Searching Authority of PCT/CN2015/074494 in Chinese, dated Jul. 29, 2015 with English translation.
Chinese Office Action in Chinese Application No. 201410645780.5, dated Aug. 30, 2016 with English translation.
Second Chinese Office Action in Chinese Application No. 201410645780.5, dated Mar. 1, 2017 with English translation.

* cited by examiner

US 9,837,480 B2

ARRAY SUBSTRATE WITH DOUBLE-GATE TFT, METHOD OF FABRICATING THE SAME, AND DISPLAY DEVICE

CROSS REFERENCE TO RELATED APPLICATIONS

This application is the National Stage of PCT/CN2015/074494 filed on Mar. 18, 2015, which claims priority under 35 U.S.C. §119 of Chinese Application No. 201410645780.5 filed on Nov. 10, 2014, the disclosure of which is incorporated by reference.

TECHNICAL FIELD

The present disclosure relates to an array substrate, a method of fabricating the array substrate and a display device.

BACKGROUND

Organic light emitting diodes (OLED) become red-hot flat panel display products worldwide in recent years. That is because an OLED display has characteristics such as self-luminous, a wide view, a short response time, a high light-emitting efficiency, a wide color gamut, a low working voltage, a thin panel, being able to be produced with a large size and a flexible panel, and a simple manufacturing process, etc. In addition, the OLED display has potential to be further developed with a low cost.

SUMMARY

An array substrate, a method of fabricating the array substrate and a display device are provided in at least one embodiment of the present disclosure. In the array substrate, thin-film transistor (TFT) performance can be optimized, a gate line resistance can be reduced, and light can be blocked from irradiating on an active layer. It is beneficial to restrain resistance voltage drop (IR Drop), drifting of TFT threshold voltages or generation of light-generated leakage current in the active layer. Therefore, performance of the display device is improved.

An array substrate is provided in at least one embodiment of the present disclosure, comprising: a first gate electrode metal layer; a first gate insulation layer on the first gate electrode metal layer; an active layer that corresponds to the first gate electrode metal layer and is disposed on the first gate insulation layer; an etching barrier layer on the active layer; a source-drain metal layer comprising a source electrode and a drain electrode, where the source electrode and the drain electrode contact with two sides of the active layer respectively and are separated from each other on the etching barrier layer; a second gate insulation layer on the source-drain metal layer; and a second gate electrode metal layer on the second gate insulation layer.

In at least one embodiment of the present disclosure, a position where the first gate electrode metal layer is formed on the array substrate corresponds to a position where the second gate electrode metal layer is formed on the array substrate.

In at least one embodiment of the present disclosure, the array substrate further comprises a connection electrode, which electrically connects the first gate electrode metal layer with the second gate electrode metal layer.

In at least one embodiment of the present disclosure, the array substrate further comprises a through hole which runs through the first gate insulation layer, the etching barrier layer and the second gate insulation layer. The connection electrode is provided within the through hole and contacts with the first gate electrode metal layer and the second gate electrode metal layer.

In at least one embodiment of the present disclosure, the array substrate further comprises: a passivation layer on the source-drain metal layer; a planarization layer on the passivation layer; a metal electrode layer on the planarization layer, configured to connect to an anode of an OLED.

A method for fabricating an array substrate is provided in at least one embodiment of the present disclosure. The method includes: forming a pattern comprising a first gate electrode metal layer on a base; forming a pattern comprising a first gate insulation layer on the first gate electrode metal layer; forming a pattern comprising an active layer on the first gate insulation layer; forming a pattern comprising a source-drain metal layer, where the source-drain metal layer comprises a source electrode and a drain electrode, and the source electrode and the drain electrode contact with two sides of the active layer respectively and are separated from each other on the etching barrier layer; forming a pattern comprising a second gate insulation layer on the source-drain metal layer; and forming a pattern comprising a second gate electrode metal layer on the second gate insulation layer.

In at least one embodiment of the present disclosure, the first gate electrode metal layer is formed on a first position that corresponds to a second position where the second gate electrode metal layer is formed on the array substrate.

In at least one embodiment of the present disclosure, the pattern comprising the first gate insulation layer, the pattern comprising the etching barrier layer and the pattern comprising the second gate insulation layer comprise a pattern that includes a through hole corresponding to a same position on the array substrate. The pattern comprising the second gate electrode metal layer further comprises a pattern comprising a connection electrode, and the connection electrode is provided in the through hole and contacts with the first gate electrode metal layer and the second gate electrode metal layer.

In at least one embodiment of the present disclosure, after forming the pattern comprising the second gate electrode metal layer on the second gate insulation layer, the method further comprises: forming a pattern comprising a passivation layer; forming a pattern comprising a planarization layer; forming a pattern comprising a metal electrode layer. The metal electrode layer may be connected to an anode of an OLED.

A display device is provided in at least one embodiment of the present disclosure. The display device may include any one of the array substrates described above.

It is noted that any product or method of the present disclosure dose not need to be implemented with all the merits, functions or effects described above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

The inventors of the present disclosure have noted that, in applications with large size displays, because a certain resistance exists in a power line of a back panel and driving currents for all pixels are supplied via unit power lines ARVDD, power voltages in a region closer to a power supply position of the ARVDD are higher than power voltages in a region farther from the power supply position of the ARVDD in the back panel. This phenomenon is referred to as resistance voltage drop (IR Drop). Because voltages of the ARVDD relate to currents, the resistance voltage drop (IR Drop) may cause currents in different regions to be different, leading to defects with non-uniform display (Mura).

In another aspect, during a fabrication process of an array substrate, five steps including film forming, exposing, etching, peeling and developing may be required to form a structure of each layer, where most steps in the fabrication process of the array substrate include irradiating light (such as ultraviolet rays) on the array substrate. Drifting of a threshold voltage can occur on an active layer in a TFT (thin film transistor) of an AMOLED (Active Matrix Organic Light Emitting Diode) substrate in response to a light irradiating on the active layer, which can have an adverse influence on uniform display of an image and make the fabrication process more complex. In addition, for an AMOLED apparatus with a bottom emitting structure, light emitted by an OLED light-emitting material may irradiate on the active layer after passing through the lower substrate. As a result, a light-incurred leakage current may be generated, and a power consumption of the display device may be increased.

Figure 1:
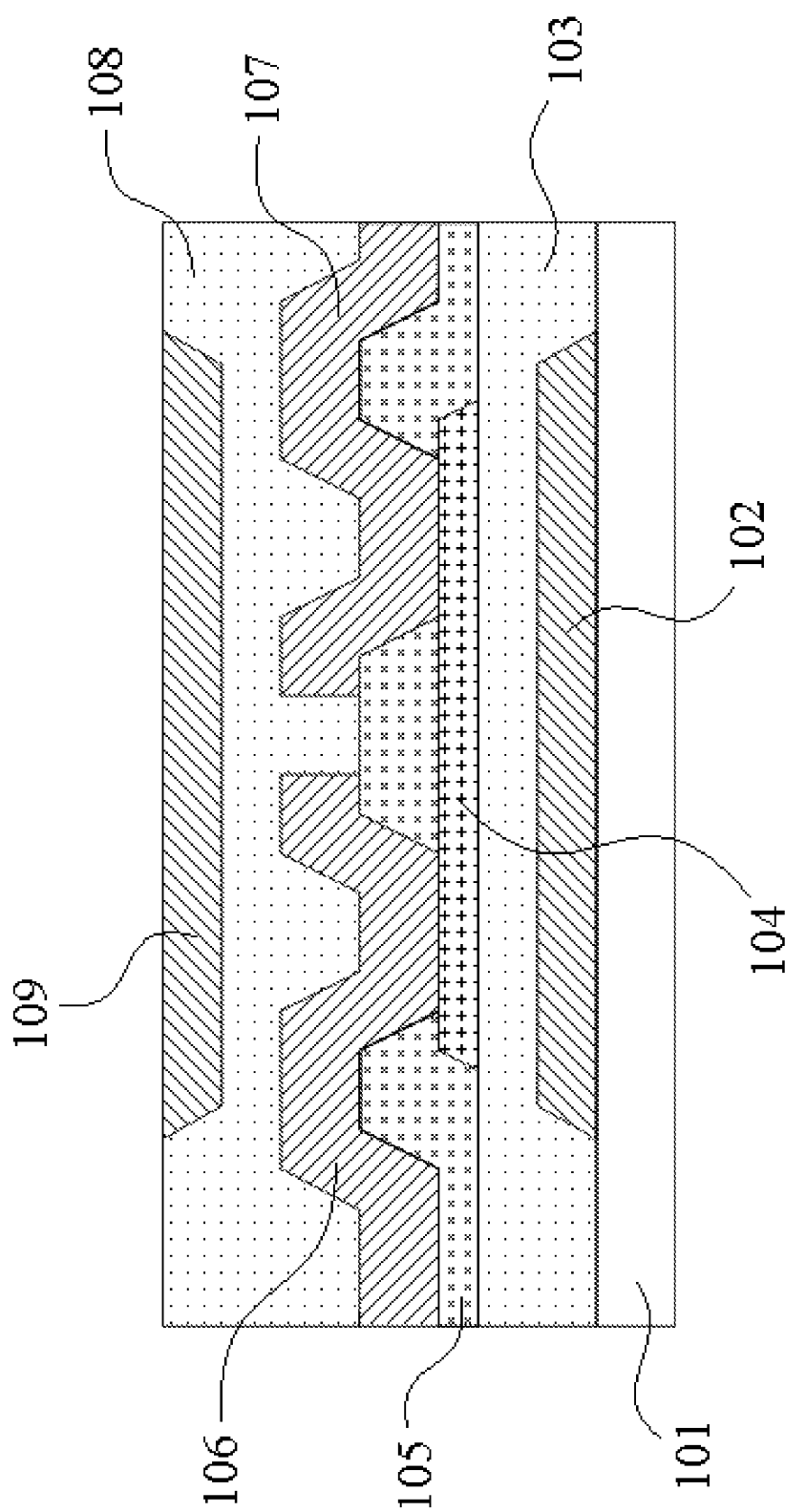
FIG. 1 is a partial sectional view of an array substrate in an embodiment of the present disclosure.

FIG. 1 is a partial sectional view of an array substrate in an embodiment of the present disclosure. Referring to FIG. 1, the array substrate comprises the following structures.

A first gate electrode metal layer 102, for example, may include a TFT gate electrode area, wires of a scan signal line and/or a high-level voltage line on the array substrate. The first gate electrode metal layer 102 is usually formed of conductive opaque metal such as molybdenum (Mo), titanium (Ti), copper (Cu) and/or aluminum (Al), etc. In at least one embodiment, the first gate electrode metal layer 102 can be formed on a transparent base 101.

A first gate insulation layer 103 is provided on the first gate electrode metal layer 102, and is formed with material that has good insulativity including, for example, silicon dioxide or silicon nitride.

An active layer 104 is provided on the first gate insulation layer 103 at a location corresponding to the first gate electrode metal layer 102, and the active layer 104 can be formed of a semiconductor material such as an oxide semiconductor that includes at least one of indium (In), calcium (Ca) and zinc (Zn).

An etching barrier layer 105 is provided on the active layer 104, and is formed of material with good insulativity including, for example, silicon dioxide.

A source-drain metal layer comprises a source electrode 106 and a drain electrode 107. The source electrode 106 and the drain electrode 107 contact with two sides of the active layer 104 respectively, and are separated from each other on the etching barrier layer 105. Material used to form the source-drain metal layer includes a conductive opaque metal such as molybdenum (Mo), titanium (Ti), copper (Cu) and/or aluminum (Al), etc. The source-drain metal layer can also include a wire of a data signal line on the array substrate.

A second gate insulation layer 108 is provided on the source-drain metal layer, and is formed with material with good insulativity that includes, for example, silicon dioxide or silicon nitride.

A second gate electrode metal layer 109 is provided on the second gate insulation layer 108, and is formed with material that includes a conductive and light-proof metal including, for example, molybdenum (Mo), titanium (Ti), copper (Cu) and/or aluminum (Al), etc.

In at least one embodiment, the array substrate further comprises the following structures.

Figure 6:
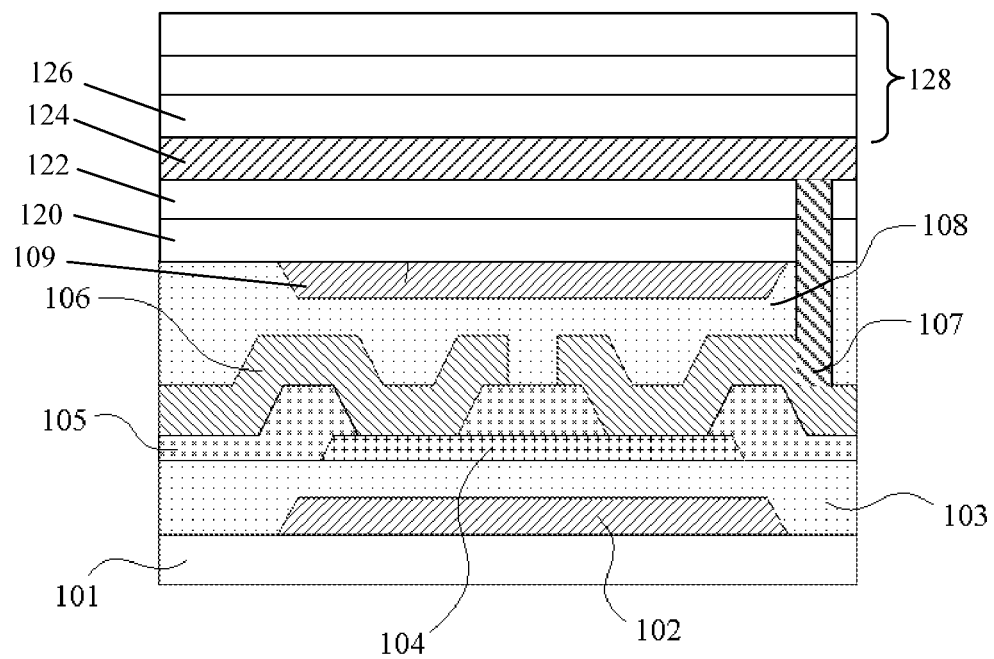
FIG. 6 is a partial sectional view of an array substrate in an embodiment of the present disclosure.

A passivation layer 120 (shown in FIG. 6) is provided on the source-drain metal layer, and can be formed with the same material as the first gate insulation layer 103 and/or the second gate insulation layer 108 such as silicon dioxide or silicon nitride;

A planarization layer 122 is provided on the passivation layer 120. The planarization layer 122 is mainly configured for planarizing an upper surface of the array substrate and is formed with material that includes silicon dioxide, silicon nitride and/or resin.

A metal electrode layer 124 is provided on the planarization layer 122. The metal electrode layer 124 is mainly configured to connect to an anode 126 of an organic light-emitting diode (OLED) 128. The metal electrode layer 124 can be formed of a commonly used metal such as molybdenum (Mo), titanium (Ti), cupper (Cu) or aluminum (Al), etc.

That is, the second gate insulation layer 108 and the second gate electrode metal layer 109 are provided between (1) the patterns comprising the active layer 104, the etching barrier layer 105 and the source-drain metal layer and (2) the pattern comprising the passivation layer 120 according to one embodiment. The array substrate supplies an anode voltage to an OLED in the AMOLED display panel. Other structures can also be provided on the second gate electrode metal layer 109, which will not be limited in the embodiments of the present disclosure.

It can be seen that the first gate electrode metal layer 102 and the second gate electrode metal layer 109 provide two gate electrodes of the TFT, where the two gate electrodes, the source electrode 106, the drain electrode 107 and the active layer 104 form a basic structure of the TFT. The TFT can be any one of the TFTs in the circuit structure of the array substrate.

It can be learned from the technical solution described above that the second gate electrode metal layer 109 and the first gate electrode metal layer 102 can be connected to the scan signal line together and supplied with a gate line voltage. In a transmission process of the gate line voltage, it is equivalent to connect the resistance of the first gate electrode metal layer 102 and the resistance of the second gate electrode metal layer 109 in parallel. As a result, resistance of the gate line is effectively reduced, and the resistance voltage drop (IR Drop) is alleviated. Because a double gate structure is employed in the TFT, an on-state current of the TFT is increased and an off-state leakage current of the TFT is reduced, thereby optimizing characteristics of the TFT.

In addition, because the second gate insulation layer 108 and the second gate electrode metal layer 109 (generally, metal material is light-proof) are provided on the active layer 104, light that is likely to be irradiated on the active layer 104 in subsequent fabrication processes can be blocked. Thus, drifting of the TFT threshold voltage is restrained. Also, the structure described above can block light that irradiates towards the active layer 104 from the OLED in the finished array substrate, thereby effectively restraining generation of light-incurred leakage current.

In at least one embodiment of the present disclosure, the first gate electrode metal layer 102 is formed on a position that corresponds to a position of the second gate electrode metal layer 109 on the array substrate. In other words, positions of the second gate electrode metal layer 109 and the first gate electrode metal layer 102 are merely different with respect to up and down locations in a vertical structure of the array substrate in a side view, and are completely overlapped with each other when projected in a horizontal surface of the array substrate in a plan view. Based on this characteristic, a same mask can be employed to form the first gate electrode metal layer 102 and the second gate electrode metal layer 109, with no need to add extra expense for designing and manufacturing another mask. It is noted that the second gate electrode metal layer 109 may have another shape that is not corresponding to the first gate electrode metal layer 102, which will not be limited in the disclosure.

In at least one embodiment of the present disclosure, the array substrate mentioned above can further comprise a connection electrode, configured to form an electrical connection between the first gate electrode metal layer 102 and the second gate electrode metal layer 109. For example, the second gate electrode metal layer 109 can be electrically connected to the first gate electrode metal layer 102 on a corresponding region adjacent to each TFT or within an area of the scan signal line of each TFT.

Figure 2:
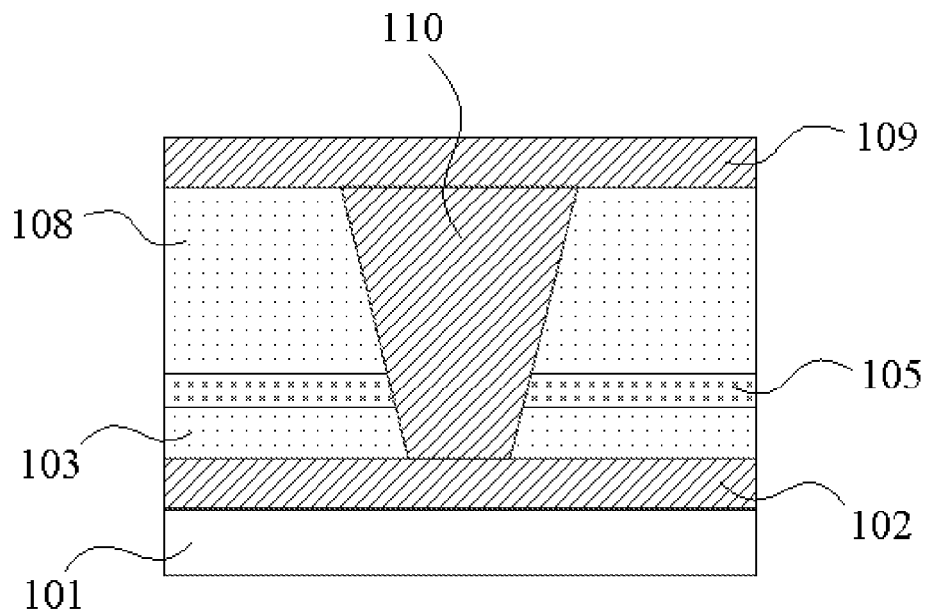
FIG. 2 is a schematic view for a structure of a connection electrode in an array substrate in an embodiment of the present disclosure.

For example, FIG. 2 is a schematic view illustrating a structure of a connection electrode in an array substrate in an embodiment of the present disclosure. The array substrate further comprises a through hole which runs through the first gate insulation layer 103, the etching barrier layer 105 and the second gate insulation layer 108 (the through hole is illustrated in FIG. 2 to surround an area where the connection electrode 110 is located). The connection electrode 110 is provided in the through hole and contacts with the first gate electrode metal layer 102 and the second gate electrode metal layer 109. An electrical connection between the first gate electrode metal layer 102 and the second gate electrode metal layer 109 can be achieved by configuring the through hole on an area where the scan signal line locates or an area where the TFT locates.

Figure 3:
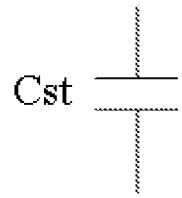
FIG. 3 is a schematic view for a structure of a storage capacitor Cst in a TFT with a bottom gate structure.

FIG. 3 is a schematic view illustrating a structure of a storage capacitor Cst of a TFT with a bottom gate structure. Under this circumstance, the source-drain metal layer is equivalent to a first polar plate of the storage capacitor Cst and the gate electrode metal layer is equivalent to a second polar plate of the storage capacitor Cst. Thus, the storage capacitor Cst can be configured to have a certain capacitance.

Figure 4:
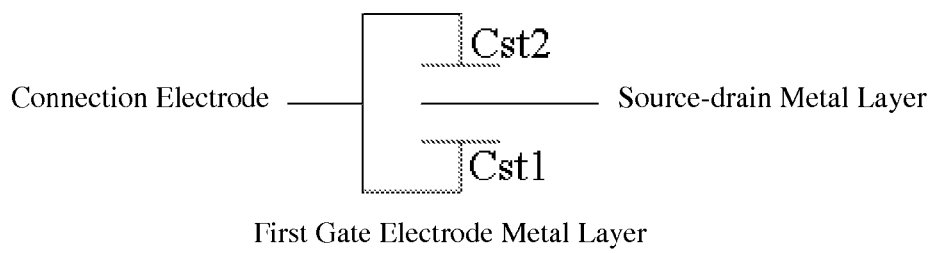
FIG. 4 is a schematic view for a structure of a storage capacitor Cst in a TFT on an array substrate in an embodiment of the present disclosure.

In an embodiment of the present disclosure, the storage capacitor is divided into two parts due to existence of the second gate electrode metal layer 109. FIG. 4 is a schematic view illustrating a structure of a storage capacitor Cst of a TFT on an array substrate in one embodiment of the present disclosure. The storage capacitor comprises a first storage capacitor Cst1 that employs the first gate electrode metal layer 102 and the source-drain metal layer as two polar plates and a second storage capacitor Cst2 that employs the second gate electrode metal layer 109 and the source-drain metal layer as two polar plates. Because the connection electrode electrically connects the first gate electrode metal layer 102 and the second gate electrode metal layer 109, which is equivalent to connect the Cst1 and Cst2 in parallel, the total capacitance is equal to a sum of the capacitance of Cst1 and the capacitance of Cst2. Therefore, capacitance of the storage capacitor is greatly increased. Correspondingly, an aperture ratio of the display device is also increased and the power consumption of the display device is reduced.

It is noted that, the connection electrode can be formed in another manner besides using the through hole and can also be located at other positions on the array substrate to achieve the same technical effect described above, which will not be limited in embodiments of the present disclosure.

Figure 5:
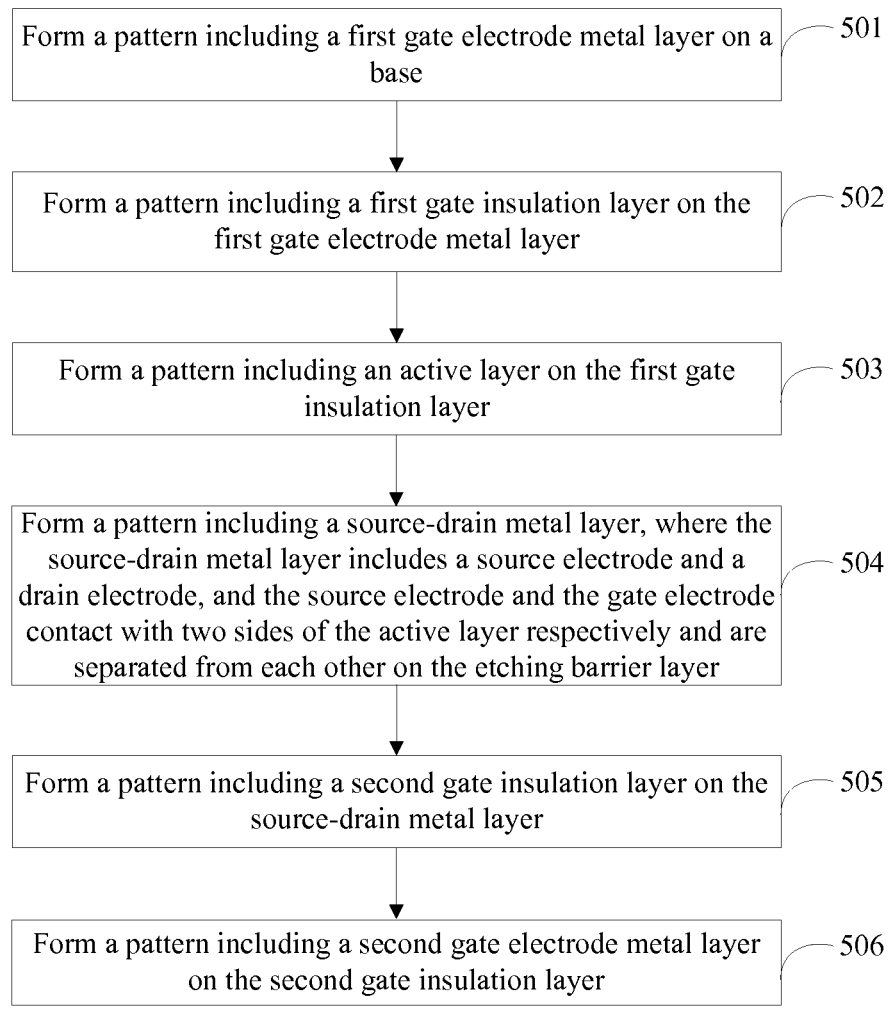
FIG. 5 is a flow chart of a method of fabricating an array substrate in an embodiment of the present disclosure.

FIG. 5 is a flow chart illustrating a method of fabricating an array substrate in an embodiment of the present disclosure. Referring to FIG. 5, the method comprises the following steps:

Step 501: forming a pattern comprising a first gate electrode metal layer on a base;

Step 502: forming a pattern comprising a first gate insulation layer on the first gate electrode metal layer;

Step 503: forming a pattern comprising an active layer on the first gate insulation layer;

Step 504: forming a pattern comprising a source-drain metal layer, where the source-drain metal layer comprises a source electrode and a drain electrode, and the source electrode and the drain electrode contact with two sides of the active layer respectively and are separated from each other on the etching barrier layer;

Step 505: forming a pattern comprising a second gate insulation layer on the source-drain metal layer; and Step 506: forming a pattern comprising a second gate electrode metal layer on the second gate insulation layer.

Any one of the array substrates mentioned above can be fabricated according to the method of fabricating an array substrate. Therefore, in the array substrate, TFT characteristics may be optimized, resistance of the gate line can be reduced, and light can be blocked from irradiating on the active layer. Hence, it is beneficial to restrain the IR Drop and to prevent drifting of the TFT threshold voltage and generation of light-incurred leakage current. Thus, performance of the display device is improved.

In at least one embodiment of the present disclosure, the first gate electrode metal layer is formed on a position corresponding to a position of the second gate electrode metal layer on the array substrate. Based on this feature, a same mask can be employed to form the first gate electrode metal layer and the second gate electrode metal layer, with no need to add an extra cost to design and manufacture another mask. Alternatively, the second gate electrode metal layer can also be formed with another shape that is not corresponding to that of the first gate electrode metal layer, which will not be limited in embodiments of the present disclosure.

In at least one embodiment of the present disclosure, the pattern comprising the first gate insulation layer, the pattern comprising the etching barrier layer and the pattern comprising the second gate insulation layer comprise a pattern that includes a through hole corresponding to a same position on the array substrate. The pattern comprising the second gate electrode metal layer further comprises a pattern comprising a connection electrode, and the connection electrode is provided in the through hole and contacts with the first gate electrode metal layer and the second gate electrode metal layer. Capacitance of a storage capacitor in each TFT is greatly increased according to embodiments of the present disclosure. Correspondingly, the aperture ratio is also increased and the power consumption of a display device is reduced.

In at least one embodiment of the present disclosure, after forming the pattern comprising the second gate electrode metal layer on the second gate insulation layer, the method can further comprise steps which are not illustrated in FIG. 5:

Step 507: forming a pattern comprising a passivation layer;

Step 508: forming a pattern comprising a planarization layer; and

Step 509: forming a pattern comprising a metal electrode layer, where the metal electrode layer is configured to be connected to an anode of an OLED.

That is, in this embodiment, the second gate insulation layer and the second gate electrode metal layer are provided between (1) the patterns comprising the active layer, the etching barrier layer and the source-drain metal layer and (2) the pattern comprising the passivation layer. The array substrate is configured to supply an anode voltage to an OLED in an AMOLED display panel. Other structures can also be provided on the second gate electrode metal layer, which will not be limited in the embodiments of the present disclosure.

In another embodiment of the present disclosure, a display device is provided. The display device includes any one of the array substrates mentioned above. The display device can be any product or component having a display function such as an electronic paper, a cell phone, a tablet computer, a TV set, a laptop computer, a digital photo frame, a navigator or a watch, etc. The display device provided in the embodiment of the present disclosure has the same technical features with that of any one of the array substrates mentioned above, and therefore, they can solve the same technical problem and achieve the same technical effect.

It should be noted that size of a layer or an area may be exaggerated to illustrate more explicitly in some attached figures. It is understandable that if an element or a layer is said to be 'on' another element or layer, it can be directly on the other element or an intermediate layer may exist therebetween. Similarly, if an element or a layer is said to be 'under' another element or another layer, it can be directly under another element or an intermediate element or layer can exist therebetween. Further, if a layer or an element is said to be 'between' two layers or 'between' two elements, it can be the only layer between the two layers or between the two elements, or one or more intermediate layer or element can exist. Similar reference marks refer to similar elements.

The terms 'first,' 'second,' etc., which are used in the description and the claims of the present application for invention, are not intended to indicate any sequence, amount or importance, but distinguish various components or operations. The terms 'comprise,' 'comprising,' 'include,' 'including,' etc., are intended to specify that the elements or the objects stated before these terms encompass the elements or the objects and equivalents thereof listed after these terms, but do not preclude the other elements or objects.

The terms 'up,' 'down,' etc., are only used to indicate relative position based on the attached figure in order to make the description easier and simpler, which are not to indicate that a device or an element must be provided, constructed or operated as the specified position, and it should not be interpreted as a limitation to the present invention. Unless otherwise defined, the term 'assemble', 'connected' or 'connection' should be understood in their broad sense, for example, the connection may be a fixed connection, a dismountable connection, or an integrated connection; it can be mechanical connection or electrical connection; it can be direct connection or indirect connection via an intermediate or internal connection of two elements. For those skilled in the art, the specific meaning of these terms in the present invention can be understood according to actual situation.

What are described above is related to the illustrative embodiments of the disclosure only and not limitative to the scope of the disclosure; the scopes of the disclosure are defined by the accompanying claims.

This application claims the benefit of Chinese patent application No. 201410645780.5 filed on Nov. 10, 2014, which is hereby incorporated by reference in its entirety as part of this disclosure.

The invention claimed is:

1. An array substrate, comprising:
   a first gate electrode metal layer including a first gate electrode;
   a first gate insulation layer on the first gate electrode metal layer;
   an active layer that corresponds to the first gate electrode metal layer and is disposed on the first gate insulation layer;
   an etching barrier layer on the active layer;
   a source-drain metal layer comprising a source electrode and a drain electrode, wherein the source electrode and the drain electrode contact with two sides of the active layer respectively and are separated from each other on the etching barrier layer;
   a second gate insulation layer on the source-drain metal layer; and
   a second gate electrode metal layer on the second gate insulation layer, the second gate electrode metal layer including a second gate electrode,
   wherein both a pattern of the first gate electrode and a pattern of the second gate electrode are simultaneously greater than a pattern of the active layer.

2. The array substrate according to claim 1, wherein a position where the first gate electrode metal layer is formed on the array substrate corresponds to a position where the second gate electrode metal layer is formed on the array substrate.

3. The array substrate according to claim 1, wherein the array substrate further comprises a connection electrode that electrically connects the first gate electrode metal layer with the second gate electrode metal layer.

4. The array substrate according to claim 3, wherein the array substrate further comprises a through hole which runs through the first gate insulation layer, the etching barrier layer and the second gate insulation layer, and the connection electrode is disposed in the through hole and contacts with the first gate electrode metal layer and the second gate electrode metal layer.

5. The array substrate according to claim 1, further comprising:
   a passivation layer on the source-drain metal layer;
   a planarization layer on the passivation layer; and
   a metal electrode layer on the planarization layer, the metal electrode layer configured to connect to an anode of an organic light emitting diode.

6. A method for fabricating an array substrate, comprising:
   forming a pattern comprising a first gate electrode metal layer on a base, the first gate electrode metal layer including a first gate electrode;
   forming a pattern comprising a first gate insulation layer on the first gate electrode metal layer;
   forming a pattern comprising an active layer on the first gate insulation layer;
   forming an etching barrier layer on the active layer;
   forming a pattern comprising a source-drain metal layer, wherein the source-drain metal layer comprises a source electrode and a drain electrode, and the source electrode and the drain electrode contact with two sides of the active layer respectively and are separated from each other on the etching barrier layer;
   forming a pattern comprising a second gate insulation layer on the source-drain metal layer; and
   forming a pattern comprising a second gate electrode metal layer on the second gate insulation layer, the second gate electrode metal layer including a second gate electrode,
   wherein both a pattern of the first gate electrode and a pattern of the second gate electrode are simultaneously greater than a pattern of the active layer.

7. The method according to claim 6, wherein a position where the first gate electrode metal layer is formed on the array substrate corresponds to a position where the second gate electrode metal layer is formed on the array substrate.

8. The method according to claim 7, wherein the pattern comprising the first gate insulation layer, the pattern comprising the etching barrier layer and the pattern comprising the second gate insulation layer include a pattern that comprises a through hole corresponding to a same position on the array substrate; and
   wherein the pattern comprising the second gate electrode metal layer further comprises a pattern comprising a connection electrode, and the connection electrode is disposed in the through hole and contacts with the first gate electrode metal layer and the second gate electrode metal layer.

9. The method according to claim 6, wherein after forming the pattern comprising the second gate electrode metal layer on the second gate insulation layer, the method further comprises:
   forming a pattern comprising a passivation layer;
   forming a pattern comprising a planarization layer; and
   forming a pattern comprising a metal electrode layer, wherein the metal electrode layer is configured to connect to an anode of an organic light emitting diode.

10. A display device, comprising the array substrate according to claim 1.

11. The array substrate according to claim 2, wherein the array substrate further comprises a connection electrode that electrically connects the first gate electrode metal layer with the second gate electrode metal layer.

12. The array substrate according to claim 11, wherein the array substrate further comprises a through hole which runs through the first gate insulation layer, the etching barrier layer and the second gate insulation layer, and the connection electrode is disposed in the through hole and contacts with the first gate electrode metal layer and the second gate electrode metal layer.

13. The array substrate according to claim 2, further comprising:
   a passivation layer on the source-drain metal layer;
   a planarization layer on the passivation layer; and
   a metal electrode layer on the planarization layer, the metal electrode layer configured to connect to an anode of an organic light emitting diode.

14. The array substrate according to claim 3, further comprising:
   a passivation layer on the source-drain metal layer;
   a planarization layer on the passivation layer; and
   a metal electrode layer on the planarization layer, the metal electrode layer configured to connect to an anode of an organic light emitting diode.

15. The array substrate according to claim 4, further comprising:
   a passivation layer on the source-drain metal layer;
   a planarization layer on the passivation layer; and
   a metal electrode layer on the planarization layer, the metal electrode layer configured to connect to an anode of an organic light emitting diode.

16. The array substrate according to claim 2, wherein the array substrate further comprises a through hole which runs through the first gate insulation layer, the etching barrier layer and the second gate insulation layer, and a connection electrode is disposed in the through hole and contacts with the first gate electrode metal layer and the second gate electrode metal layer.

17. The array substrate according to claim 1, wherein the array substrate further comprises a through hole which runs through the first gate insulation layer, the etching barrier layer and the second gate insulation layer, and a connection electrode is disposed in the through hole and contacts with the first gate electrode metal layer and the second gate electrode metal layer.

18. The array substrate according to claim 1, wherein the first gate electrode metal layer and the second gate electrode metal layer are connected to a common scan signal line.

19. The method according to claim 7, wherein after forming the pattern comprising the second gate electrode metal layer on the second gate insulation layer, the method further comprises:
   forming a pattern comprising a passivation layer;
   forming a pattern comprising a planarization layer; and
   forming a pattern comprising a metal electrode layer, wherein the metal electrode layer is configured to connect to an anode of an organic light emitting diode.

20. The method according to claim 8, wherein after forming the pattern comprising the second gate electrode metal layer on the second gate insulation layer, the method further comprises:
   forming a pattern comprising a passivation layer;
   forming a pattern comprising a planarization layer; and forming a pattern comprising a metal electrode layer, wherein the metal electrode layer is configured to connect to an anode of an organic light emitting diode.

* * * * *